United States Patent
Cottet et al.

(10) Patent No.: US 8,519,433 B2
(45) Date of Patent: Aug. 27, 2013

(54) SEMICONDUCTOR SWITCHING DEVICE WITH GATE CONNECTION

(75) Inventors: Didier Cottet, Zurich (CH); Thomas Stiasny, Waedenswil (CH); Tobias Wikstroem, Egliswil (CH)

(73) Assignee: ABB Research Ltd, Zurich (CH)

( * ) Notice: Subject to any disclaimer, the term of this patent is extended or adjusted under 35 U.S.C. 154(b) by 207 days.

(21) Appl. No.: 12/813,005

(22) Filed: Jun. 10, 2010

(65) Prior Publication Data

US 2010/0270584 A1    Oct. 28, 2010

Related U.S. Application Data

(63) Continuation of application No. PCT/EP2008/066197, filed on Nov. 26, 2008.

(30) Foreign Application Priority Data

Dec. 11, 2007    (EP) .................................... 07122893

(51) Int. Cl.
*H01L 29/74*    (2006.01)

(52) U.S. Cl.
USPC ............................ 257/150; 257/151; 257/177

(58) Field of Classification Search
USPC ......................................... 257/150, 151, 177
See application file for complete search history.

(56) References Cited

U.S. PATENT DOCUMENTS

| | | | |
|---|---|---|---|
| 3,192,454 A | 6/1965 | Rosenheinrich et al. | |
| 4,063,348 A | 12/1977 | Borden et al. | |
| 4,068,368 A | 1/1978 | DeBard et al. | |
| 4,158,850 A | 6/1979 | Lehmann et al. | |
| 4,455,448 A | 6/1984 | Bertolina | |
| 4,929,856 A | 5/1990 | Grüning | |
| 5,047,836 A | 9/1991 | Tokunoh | |
| 5,345,096 A | 9/1994 | Grüning | |
| 5,635,427 A | 6/1997 | Takahashi | |
| 5,641,976 A | 6/1997 | Taguchi et al. | |
| 2002/0017399 A1 | 2/2002 | Chang et al. | |
| 2003/0062535 A1 | 4/2003 | Carroll et al. | |
| 2005/0067159 A1 | 3/2005 | Hall et al. | |

FOREIGN PATENT DOCUMENTS

| | | |
|---|---|---|
| DE | 1 241 536 | 6/1967 |
| DE | 26 41 483 A1 | 3/1978 |
| DE | 42 27 063 A1 | 2/1994 |
| EP | 0 324 929 A2 | 7/1989 |
| EP | 0 328 778 A1 | 8/1989 |
| EP | 0 669 652 A1 | 8/1995 |
| EP | 1 298 733 A1 | 4/2003 |
| JP | 61-193483 A | 8/1986 |

OTHER PUBLICATIONS

International Search Report for PCT/EP2008/066197, mailed Jul. 29, 2009.
Extended European Search Report for EP 07 12 2893, dated Feb. 18, 2008.
Written Opinion of the International Searching Authority for PCT/EP2008/066197, mailed Jul. 29, 2009.
Notification Concerning Transmittal of International Preliminary Report on Patentability (Forms PCT/IB/326 and PCT/IB/373) and the Written Opinion of the International Searching Authority (Forms PCT/ISA/237) issued in corresponding International Application No. PCT/EP2008/066197 dated Jun. 24, 2010.

*Primary Examiner* — Samuel Gebremariam
(74) *Attorney, Agent, or Firm* — Buchanan Ingersoll & Rooney PC

(57) ABSTRACT

The present disclosure provides a semiconductor switching device including a substrate having deposited thereon a cathode, an anode and a gate of the semiconductor switching device, and a connection means for electrically connecting the cathode in the gate of the semiconductor switching device to an external circuit unit. The connection includes a cathode-gate connection unit having a coaxial structure including a gate conductor and a cathode conductor for electrically connecting the cathode and the gate of the semiconductor switching device to the external circuit unit.

30 Claims, 7 Drawing Sheets

SEMICONDUCTOR SWITCHING DEVICE WITH GATE CONNECTION

RELATED APPLICATIONS

This application claims priority as a continuation application under 35 U.S.C. §120 to PCT/EP2008/066197, which was filed as an International Application on Nov. 26, 2008 designating the U.S., and which claims priority to European Application 07122893.6 filed in Europe on Dec. 11, 2007. The entire contents of these applications are hereby incorporated by reference in their entireties.

FIELD

The present disclosure relates to semiconductor switching devices having a cathode-anode-gate structure, and a connection device for an electrical connection of a semiconductor switching device to an external circuit unit. For example, a semiconductor switching device includes a substrate having deposited thereon a cathode, an anode and a gate of the semiconductor switching device and a connection for electrically connecting the cathode, the anode and the gate of the semiconductor switching device to an external circuit unit.

BACKGROUND INFORMATION

An electrical connection of a semiconductor switching device to an external circuit unit can be important, for example, if the semiconductor switching device has to handle large currents and voltages. An example of such a semiconductor switching device is an integrated gate commutated thyristor (IGCT). An IGCT is a gate-controlled turn-off switch which can turn off like an insulated gate bipolar transistor (IGBT) but conducts like a thyristor with low conductor losses. An integrated gate commutated thyristor is a power switching device for demanding high power applications such as, for example medium voltage drives, traction, wind power converters, AC excitation systems, battery energy storage systems, solid state breakers, traction line boosters, traction power compensators and induction heating. A semiconductor switching device constructed as an IGCT can be used in a variety of applications due to its versatility, efficiency and cost-effectiveness. A known IGCT device can have a ring-shaped structure, as shown in FIG. 1. A cathode disc CD is the lower surface in FIG. 1. On the cathode disc CD, a gate disc GD can be arranged providing a gate connection to the semiconductor device. An anode phase A is arranged on top of a housing H having a creepage distance Cr at the outside.

FIG. 2 is a cross-section of the arrangement shown in FIG. 1. The creepage distance Cr is formed between the anode A and the cathode disc CD. The creeping distance Cr is part of the housing H which can be formed from an insulating material, for example ceramics. In order to connect the cathode disc CD and the gate disc GD to external circuit units, a cathode conductor C and a gate conductor G can be provided. These connections can be performed using two discs, for example the gate disc GD and the cathode disc CD. These discs can be soldered to package ceramics. For mechanical reasons, the thickness of the ceramic which separates the gate disc from the cathode disc should be higher that what would be required to insulate the two potentials which are separated by a voltage of approximately 100 V.

This can result in a large distance between the gate electrode and the cathode electrode such that a total loop inductance is increased. An example of an inductance loop formed in the known connection arrangement for connecting the semiconductor switching device to an external circuit unit is shown by a reference numeral IL in FIG. 2. Stray inductance IL, shown in FIG. 2, deteriorates a turn-off performance of the semiconductor switching device. Also, the size of the semiconductor switching device is large because the thickness of a ceramic housing which separates gate and cathode discs is high.

SUMMARY

A connection device is disclosed for an electrical connection of a semiconductor switching device having a cathode disc to an external circuit unit, the connection device including a cathode-gate connection unit having a coaxial structure including a gate conductor and a cathode conductor for electrically connecting a cathode and a gate of the semiconductor switching device to the external circuit unit, wherein the cathode conductor includes a cathode connection terminal adapted for connecting the cathode conductor to the cathode disc.

A semiconductor switching device is disclosed which includes a substrate having deposited thereon a cathode disc, an anode and a gate of the semiconductor switching device, and a connection for electrically connecting the cathode disc and the gate of the semiconductor switching device to an external circuit unit, wherein the connection includes a cathode-gate connection unit having a coaxial structure including a gate conductor and a cathode conductor for electrically connecting the cathode and the gate of the semiconductor switching device to the external circuit unit, wherein the cathode conductor includes a cathode connection terminal adapted for connecting the cathode conductor to the cathode disc.

BRIEF DESCRIPTION OF THE DRAWINGS

Exemplary embodiments of the present disclosure are depicted in the drawings and are detailed in the description which follows.

DETAILED DESCRIPTION

Figure 1:
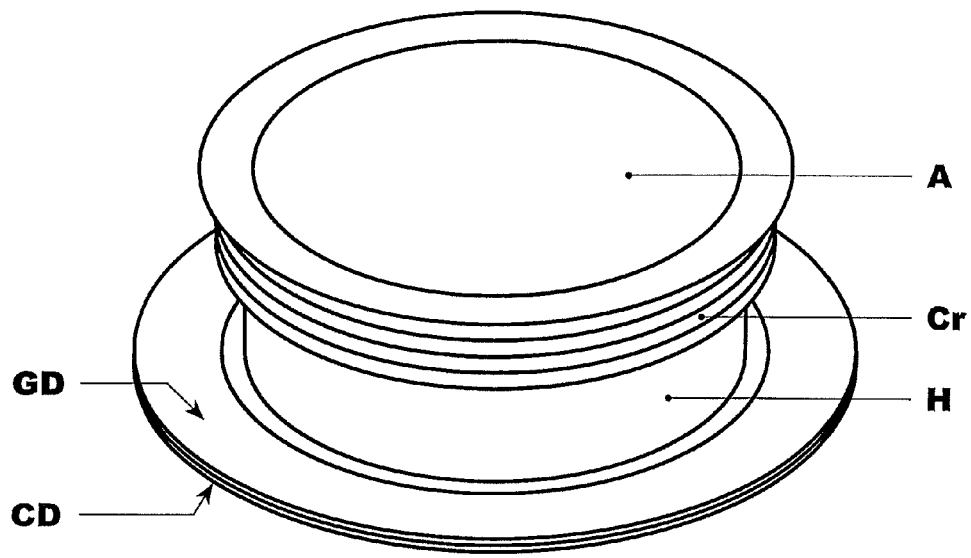
FIG. 1 is an elevation view of a known semiconductor switching device.

According to a first exemplary embodiment of the present disclosure, a connection device for an electrical connection of a semiconductor switching device having a cathode disc, to an external circuit unit is provided. The connection device includes a cathode-gate connection unit having a coaxial structure including a gate conductor and a cathode conductor for electrically connecting a cathode and a gate of the semiconductor switching device to the external circuit unit. The cathode conductor includes a cathode connection terminal adapted for connecting the cathode conductor to the cathode disc.

According to another exemplary embodiment of the present disclosure, a semiconductor switching device is provided, including a substrate having deposited thereon a cathode disc, an anode and a gate of the semiconductor switching device and a connection for electrically connecting the cathode and the gate of the semiconductor switching device to an external circuit unit The connection includes a cathode-gate connection unit having a coaxial structure including a gate conductor and a cathode conductor for electrically connecting the cathode and the gate of the semiconductor switching device to the external circuit unit. The cathode conductor includes a cathode connection terminal adapted for connecting the cathode conductor to the cathode disc.

According to yet another exemplary embodiment of the present disclosure a semiconductor switching device can be provided, including a substrate having deposited thereon a cathode, an anode and a gate of the semiconductor switching device and a connection for electrically connecting the cathode and the gate of the semiconductor switching device to an external circuit unit. The connection includes at least two cathode-gate connection units having a coaxial structure including a gate conductor and a cathode conductor for electrically connecting the cathode and the gate of the semiconductor switching device to the external circuit unit. The at least two cathode-gate connection units can be arranged symmetrically around the cathode disc.

The present disclosure is related to the idea that stray inductances in known semiconductor switching devices, for example Integrated Gate Commutated Thyristor (IGCT) devices, can be caused by inductance loops formed in the connection units. A concept of the present disclosure is related to stray inductances which can be avoided by an appropriate arrangement of inductors connecting the semiconductor switching device to external circuit units wherein a conductor arrangement includes anode, cathode and gate contacts. In order to minimize stray inductances, the gate conductor and the cathode conductor connecting the semiconductor switching device to external circuit units can be related to each other by coaxial arrangement.

This kind of coaxial arrangement may be arranged such that the gate conductor for connecting the gate of the semiconductor switching device to the external circuit unit can be formed as an inner conductor of a cathode-gate connection unit and the cathode conductor for connecting the cathode of the semiconductor switching device to the external circuit unit can be formed as an outer conductor of the cathode-gate connection unit or visa versa. The outer conductor and the inner conductor of the gate-cathode connection unit can be provided as a coaxial structure. Thus stray inductances can be minimized.

According to an exemplary embodiment of the present disclosure, a connection device for an electrical connection of a semiconductor switching device having a cathode disc to an external circuit unit can include a cathode-gate connection unit having a coaxial structure including a gate conductor and a cathode conductor electrically connecting a gate and a cathode of the semiconductor switching device to the external circuit unit. The cathode conductor includes a cathode connection terminal adapted for connecting the cathode conductor to the cathode disc.

According to an exemplary embodiment of the present disclosure, an inner conductor of the cathode-gate connection unit can be insulated from an outer conductor of the cathode-gate connection unit by an insulator including dielectric material.

According to another exemplary embodiment of the present disclosure, the inner conductor of the cathode-gate connection unit can be insulated from the outer conductor of the cathode-gate connection unit by an insulator including a polymer or ceramic based material.

The connection device can include an insulator having a thickness of less than 500 μm.

According to an exemplary embodiment of the present disclosure, a semiconductor switching device can include a substrate having deposited thereon a cathode disc, an anode and a gate of the semiconductor switching device and a connection for electrically connecting the cathode and the gate of the semiconductor switching device to an external circuit unit. The cathode conductor include a cathode connection terminal adapted for connecting the cathode conductor to the cathode disc.

The connection can include a cathode-gate connection unit having a coaxial structure including a gate conductor and a cathode conductor for electrically connecting the cathode and the gate of the semiconductor switching device to the external circuit unit.

According to another exemplary embodiment of the present disclosure, the coaxial structure can be arranged such that a gate conductor for connecting the gate of the semiconductor switching device to the external circuit unit is formed as the inner conductor of the cathode-gate connection unit and a cathode conductor for connecting the cathode of the semiconductor switching device to the external circuit unit is formed as the outer conductor of the cathode-gate connection unit. Alternatively, the cathode conductor can be formed as the inner conductor and the gate conductor can be formed as the outer conductor.

The semiconductor switching device can be an integrated gate commutated thyristor (IGCT).

According to another exemplary embodiment of the present disclosure, the connection for electrically connecting the cathode and the gate of the semiconductor switching device to an external circuit unit can be attached to a housing of the semiconductor switching device. The housing of the semiconductor switching device can be made of an insulating material. For example, the housing can be made of a ceramic or any other suitable material.

According to another exemplary embodiment of the present disclosure, the cathode disc can include a cathode pole, in particular a first cathode pole piece and a second cathode pole piece.

According to another exemplary embodiment of the present disclosure, the cathode conductor of the cathode-gate connection unit can include a cathode connection terminal for connecting the cathode conductor to the cathode disc. The gate conductor of the cathode-gate connection unit can include a gate connection terminal for connecting the gate conductor to the external circuit unit.

According to another exemplary embodiment of the present disclosure, the housing of the semiconductor switching device can include at least one creepage section at the outside thereof in order to deviate creepage currents from the anode to the cathode disc.

According to an exemplary embodiment of the present disclosure, a semiconductor switching device can include a substrate having deposited thereon a cathode, an anode and a gate of the semiconductor switching device, and a connection for electrically connecting the cathode and the gate of the semiconductor switching device to an external circuit unit.

The connection can include at least two cathode-gate connection units having a coaxial structure including a gate conductor and a cathode conductor for electrically connecting the cathode and the gate of the semiconductor switching device to the external circuit unit. The at least two cathode-gate connection units can be arranged symmetrically around the cathode disc.

According to another exemplary embodiment of the present disclosure, the inner conductor of the cathode-gate connection unit can be insulated from the outer conductor of the cathode-gate connection unit by an insulator including a dielectric material. The inner conductor of the cathode-gate connection can be insulated from the outer conductor of the cathode-gate connection unit by an insulator including a polymer or ceramic based material. The insulator can have a thickness of less than 500 µm.

Figure 3:
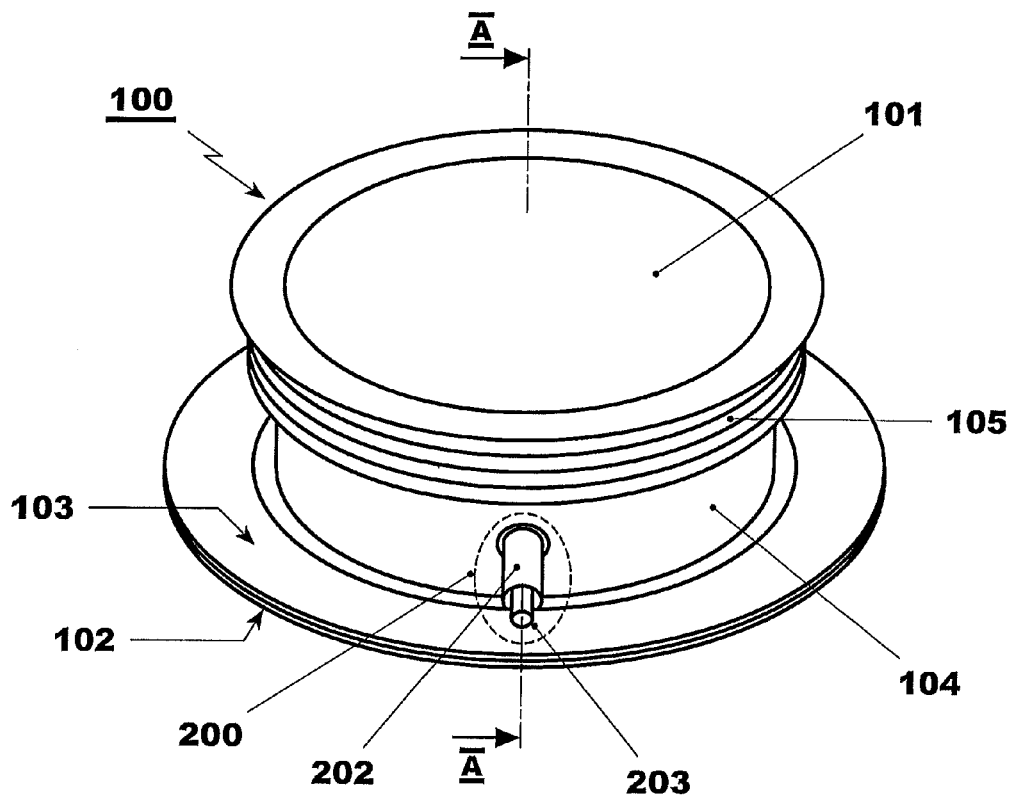
FIG. 3 is an elevation view of a semiconductor switching device according to a first exemplary embodiment of the present disclosure.

FIG. 3 shows an exemplary semiconductor switching device 100 according to an exemplary embodiment of the present disclosure. As shown in FIG. 3, the semiconductor switching device can include a cathode disc 102 and, insulated from the cathode disc 102, a gate disc 103 on top of the cathode disc 102. A housing 104 made of an insulating material, such as a ceramic material, can be placed on top of the cathode disc 102. The housing can include a creepage section 105 which can be used for insulation of the cathode disc 102 from an anode 101 placed on top of the housing 104. The creepage section 105 can provide a creepage distance from the anode 101 to the cathode disc 102 such that creepage currents are subject to an enlarged distance from the anode 101 to the cathode disc 102. In this way, an insulation between the cathode 101 and the anode disc 102 can be improved.

According to a first exemplary embodiment of the present disclosure, a cathode-gate connection unit 200 can be provided at one side of the housing 104. The cathode-gate connection unit can be used for an electrical connection of the semiconductor switching device to an external circuit unit. The connection device can be used for a connection of the gate and the cathode of the semiconductor switching device to the external circuit unit. The cathode 101 can be connected to the external circuit unit In order to avoid inductance loops (see FIG. 2), the gate and cathode connections are provided as a coaxial arrangement, as will be explained with reference to FIG. 4 herein below. The cathode-gate connection can include a coaxial structure for electrically connecting the anode and the gate of the semiconductor switching device to the external circuit unit. The cathode-gate connection unit 200 can include a cathode conductor 202 and a gate conductor 203, as shown in FIG. 3. An inner conductor of the cathode-gate connection unit 200 can be provided as the gate conductor 203, whereas an outer conductor of the cathode-gate connection unit 200 can be provided as the cathode conductor 202. The inner conductor 202 of the cathode-gate connection unit 200 can be insulated from the outer conductor 202 of the cathode-gate connection unit 200.

The insulation can include an insulator made of a dielectric material. Furthermore, the inner conductor 203 of the cathode-gate connection 200 can be insulated from the outer conductor 202 of the cathode-gate connection unit 200 by an insulator including, for example, a polymer or a ceramic based material. According to an exemplary embodiment of the present disclosure, the insulator has a thickness of less than 500 µm.

Figure 4:
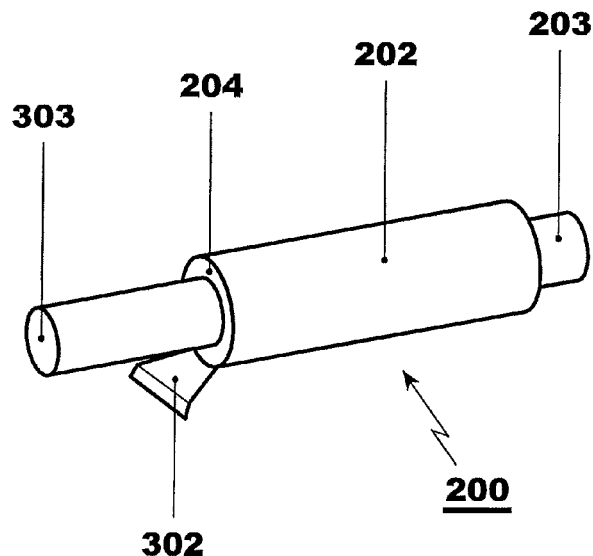
FIG. 4 illustrates the structure of an exemplary cathode-gate connection unit according to the present disclosure.

FIG. 4 illustrates the cathode-gate connection unit 200 in more detail. As described before, the gate conductor 203 can be provided as the inner conductor of the cathode-gate connection unit 200 wherein the cathode conductor 202 can be provided as the outer conductor of the cathode-gate connection unit 200. The cross-section of the cathode-gate connection unit can be circular such that a coaxial arrangement is provided as shown in FIG. 4. The cathode conductor 202 can include a cathode connection terminal 302 for connecting the cathode conductor 202 to the cathode disc, as discussed with reference to FIG. 6 below. Furthermore, the gate conductor 203 can include a gate connection terminal 303 for connecting the gate conductor 203 to the external circuit unit (not shown).

An insulator 204 can be provided in order to insulate the cathode conductor 202 from the gate conductor 203. The insulation may be, for example, air, an insulating material, such as a polymer or ceramic based material, or another suitable insulating material. Due to the structure of the cathode-gate connection unit 200, stray inductances as, for example gate-cathode loop inductances can be minimized. It is noted that the gate-cathode loop inductance is relevant parameter for a turn-off performance of an IGCT (Integrated Gate Commutated Thyristor).

Figure 5:
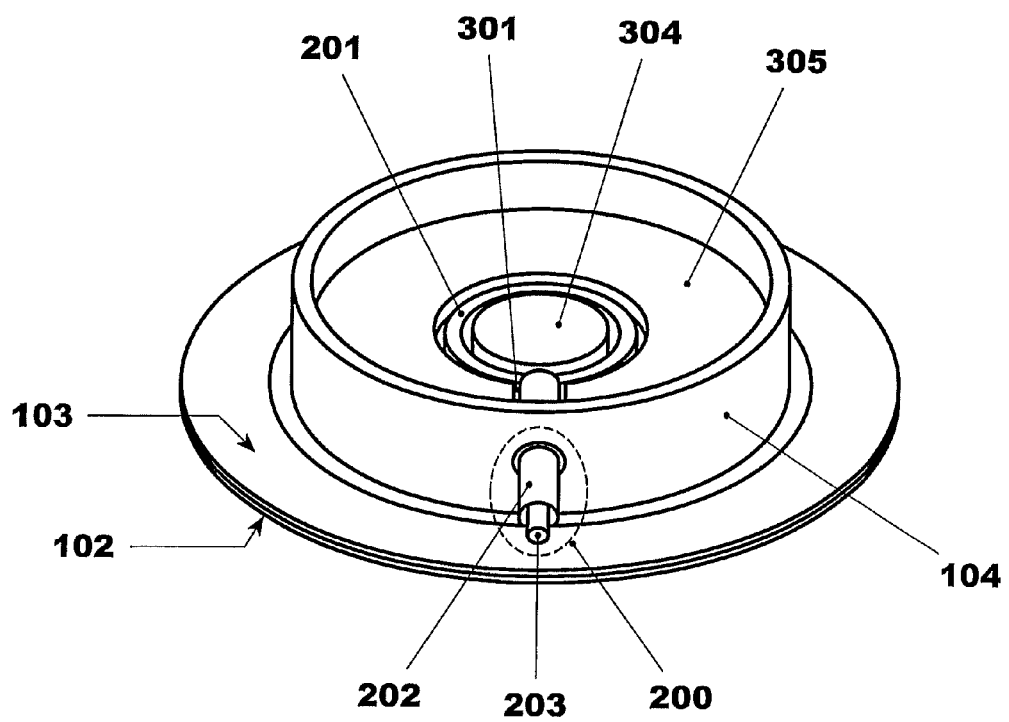
FIG. 5 shows the exemplary semiconductor switching device illustrated in FIG. 3 with the anode removed such that the interior of the semiconductor switching device can be viewed.

FIG. 5 is an elevation view of the semiconductor 100 shown in FIG. 3, wherein the exemplary semiconductor switching device 100 is shown with the anode 101 removed. Thus, the interior of the housing 104 is illustrated in more detail. It is noted that parts or components which have been described herein above are not detailed in the further description in order to ease the explanation. As shown in the interior view of the exemplary semiconductor switching device 100, the cathode disc 102 can include in the interior of the housing 104 a first cathode pole piece 304 and a second cathode pole piece 305, which are in a coaxial arrangement. Between the first cathode pole piece 304 and the second cathode pole piece 305, a gate ring 201 can be provided which is in an electrical contact with the gate disc 103. It is the gate ring 201 which has to be contacted by the gate conductor 203 of the cathode-gate connection unit 200.

The connection is described with reference to FIG. 6 below which is a cross-section of the cathode-gate connection unit together with parts of the semiconductor switching device 100. As illustrated in FIG. 5, the cathode conductor 202 can reach through the insulating housing 104 towards the interior of the housing 104, wherein the gate conductor 202 can be electrically connected to the cathode disc 102. Furthermore, it is shown that the cathode-gate connection unit can be located in a cathode trench 301.

Even though only one cathode-gate connection unit 200 is shown in FIG. 5, more than one cathode-gate connection unit 200 may be provided at the periphery of the housing 104, as is shown with reference to FIGS. 7 and 8 herein below with respect to the description of a second exemplary embodiment of the present disclosure.

Figure 6:
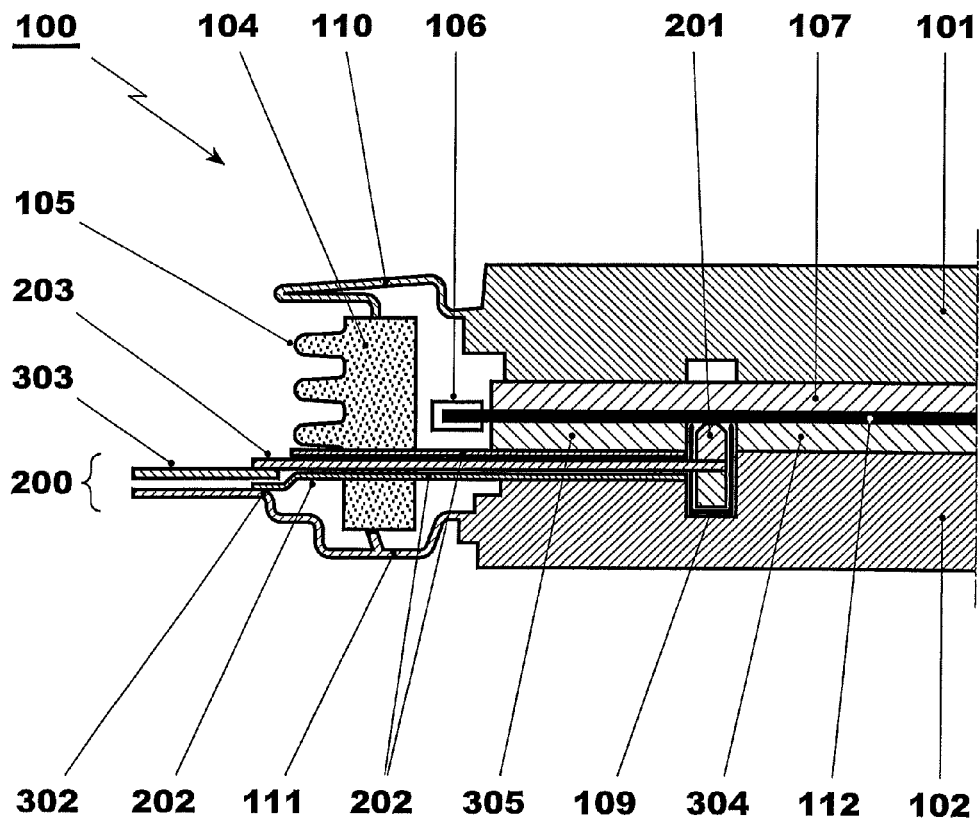
FIG. 6 is a cross-sectional view of the exemplary semiconductor switching device shown in FIG. 5.

FIG. 6 is a cross-section of a part of the semiconductor switching device 100 shown in FIG. 3 along the line A-A (see FIG. 3). The coaxial gate concept according to an exemplary embodiment can be. FIG. 6 shows parts of the cathode disc 102 and the anode 101. A substrate 112 is shown in the center part of the figure. Parts of the housing 104 and the creepage section 105 are depicted. Between the housing 104 and the substrate 112, an insulation unit 106 can be provided. At the top side, the substrate 112 can be provided as an anode contact layer 107 for contacting the anode 101. At the lower part of the substrate 112, the first cathode pole piece 304 and the second cathode pole piece 305 can be provided for contacting the cathode disc 102. Furthermore, the gate ring 201 is shown which is contacted by the gate conductor 203. It is depicted in FIG. 6 that the cathode conductor 202 is connected to the cathode disc 102.

Thus, the cross-section of FIG. 6 exhibits the cathode-gate connection unit 200 which can be mounted in a through-hole of the housing 104. In order to enable creepage currents to flow from the anode 101 to the cathode disc 102 via the creepage section 105, an anode connection 110 can be provided for connecting the housing 104 with the anode 101. A cathode connection 111 can be provided for connecting the cathode disc 102 through the housing 104.

The gate conductor 203 can be provided with the gate connection terminal 303 at the left end thereof in order to enable a connection of the gate ring 201 to external circuit units (not shown). The cathode conductor 202 can be electrically connected to the cathode disc 102 by the use of the cathode connection terminal 302. Thus, an electrical connection can be provided between the cathode conductor 202 and the cathode disc 102 directly and via the cathode connection 111 and the cathode connection terminal 302, as depicted in FIG. 6. The gate ring 201 can be insulated from the surroundings, especially from the cathode disc 102, by an insulation layer 109.

Even though circular cross-sections of the cathode gate connection unit 200 are shown in the figures (especially in FIGS. 3, 4 and 5), the cathode-gate connection unit 200 and the cathode conductor 202 as well as the gate conductor 203 may have a non-circular cross-section such as a rectangular cross-section. The present disclosure is not restricted to a specific design of the cross-section of the cathode-gate connection unit 200. According to the first exemplary embodiment of the present disclosure, shown in FIGS. 3, 4, 5 and 6, the distance between the cathode conductor 202 and the gate conductor 203 can be kept at a minimum value along the entire loop, thus ensuring a minimal loop inductance.

The cathode-gate connection unit 200 can be located in existing cathode trenches of the second cathode pole piece (see FIG. 5). Therefore, the cathode disc 102 can be connected to the cathode conductor 202, wherein the gate conductor 203 can be connected to the gate ring 201 such that an easy construction and a cost-effective manufacturing of the entire semiconductor switching device is possible. It is noted that an electrical insulation inside the coaxial connection, for example, the insulator 204, may be very thin because peak voltages which are expected are in the range of only about 100 V. The insulation material can be as hermetic as the rest of the ceramic housing 104. With a total length of 20-30 mm (depending on the IGCT substrate/package diameter) and a thickness of a few 100 µm of the insulator 204, most polymeric or ceramic based materials can be used.

The insertion of the cathode-gate connection unit 200 can enable less expensive housings 104 for the exemplary semiconductor switching device 100 such that manufacturing costs are reduced.

Figure 7:
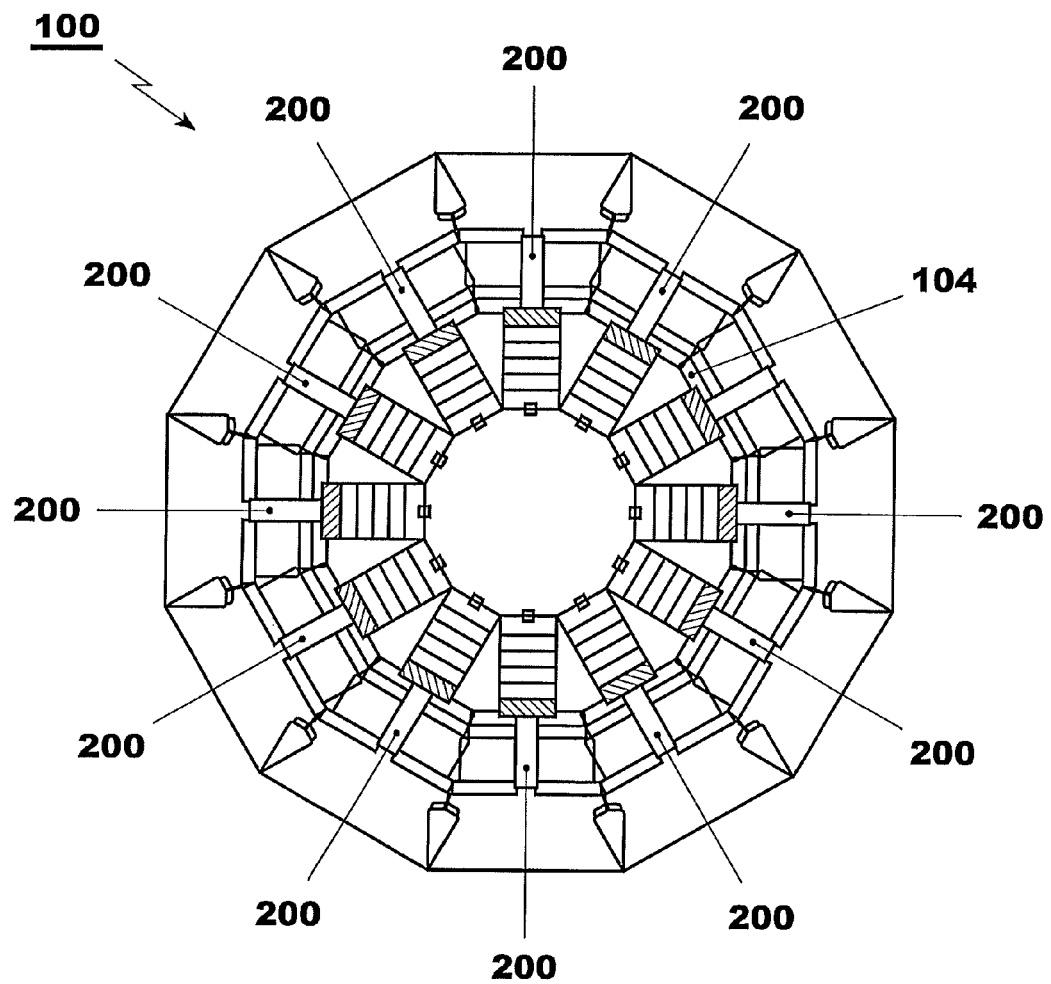
FIG. 7 is a top view of a semiconductor switching device according to the second exemplary embodiment of the present disclosure.
Figure 8:
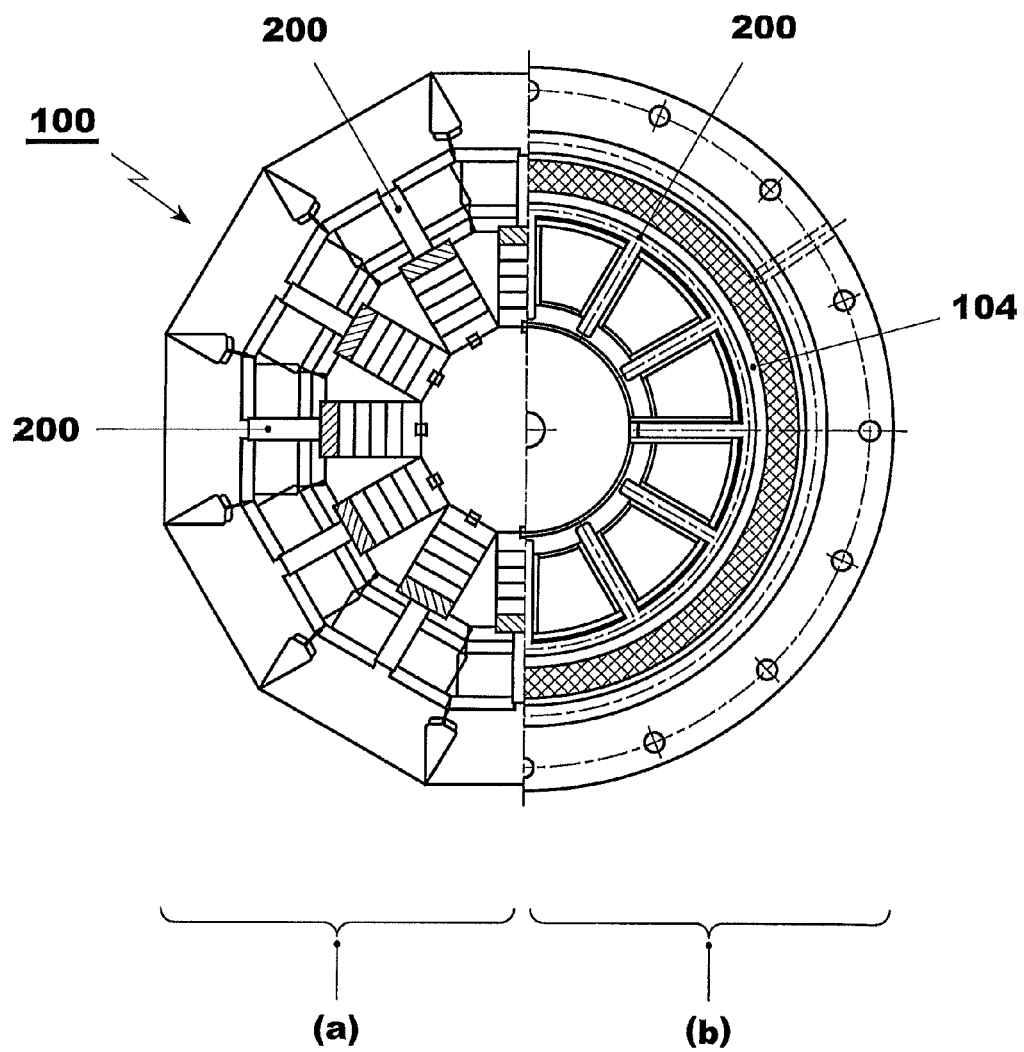
FIG. 8 is a combined top view/sectional view of the semiconductor switching device according to the second exemplary embodiment of the present disclosure.

FIGS. 7 and 8 show a top view and a cross-sectional view of an exemplary semiconductor switching device 100 according to a second exemplary embodiment of the present disclosure. As mentioned before, the present disclosure is not restricted to the provision of one single cathode-gate connection unit 200. It is possible to provide a plurality (at least two) of cathode-gate connection units 200. As shown in FIG. 7, it is possible to arrange a number of cathode-gate connection units 200 around the periphery of the housing 104 of the exemplary semiconductor switching device 100.

As shown in FIG. 7, twelve cathode-gate connection units 200 can be arranged symmetrically around the periphery of the housing 104 of the semiconductor switching device 100. In this way, the electrical connection of the semiconductor switching device 100 to the external circuit units can be improved. Each of the cathode-gate connection units 200 shown in FIG. 7 can be constructed in a manner described herein above with respect to FIGS. 3 to 6.

In FIG. 8, the semiconductor switching device 100 according to the second exemplary embodiment of the present disclosure is shown in more detail. In addition to the top view (FIG. 8(a)), a cross-sectional view through the center of the cathode-gate connection unit 200 is shown at the right side of FIG. 8(b).

Figure 2:
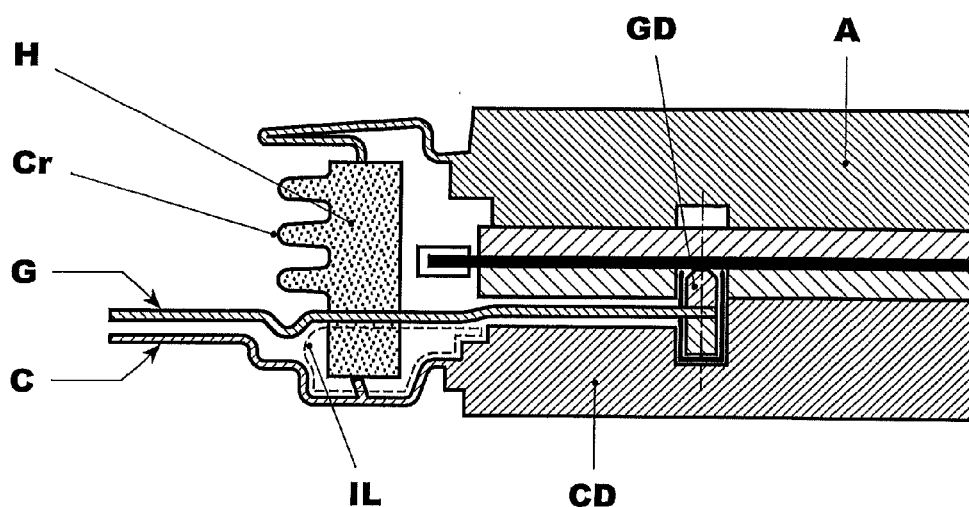
FIG. 2 is a cross-section of the known semiconductor switching shown in FIG. 1.
Figure 9:
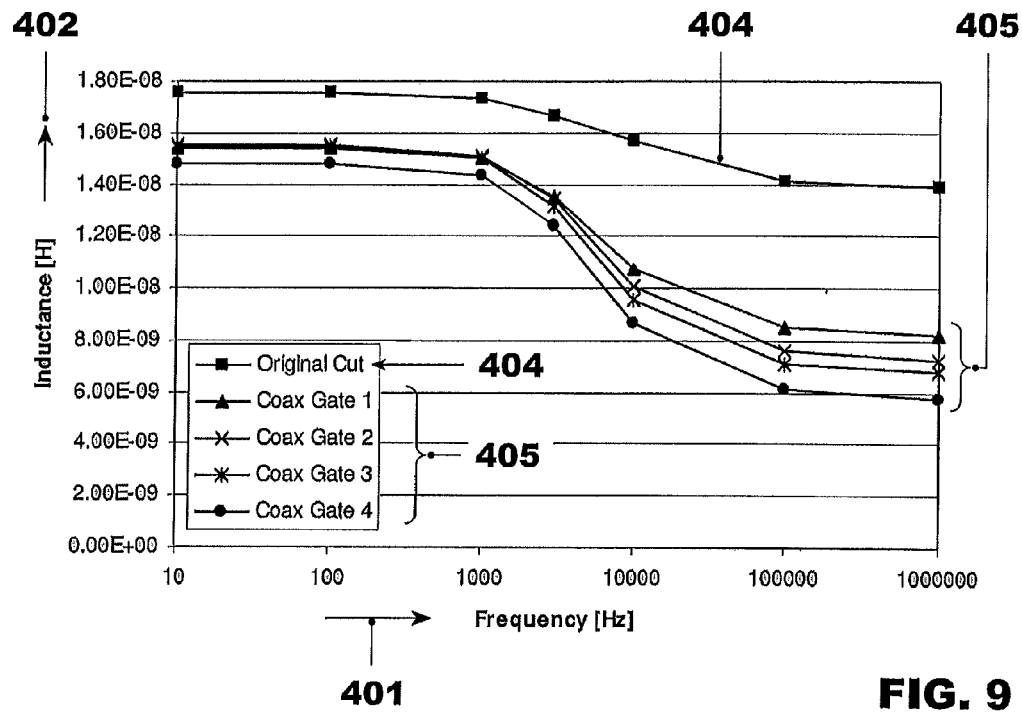
FIG. 9 illustrates simulation results for different semiconductor switching devices wherein the stray inductance is shown as a function of operation frequency.
Figure 10:
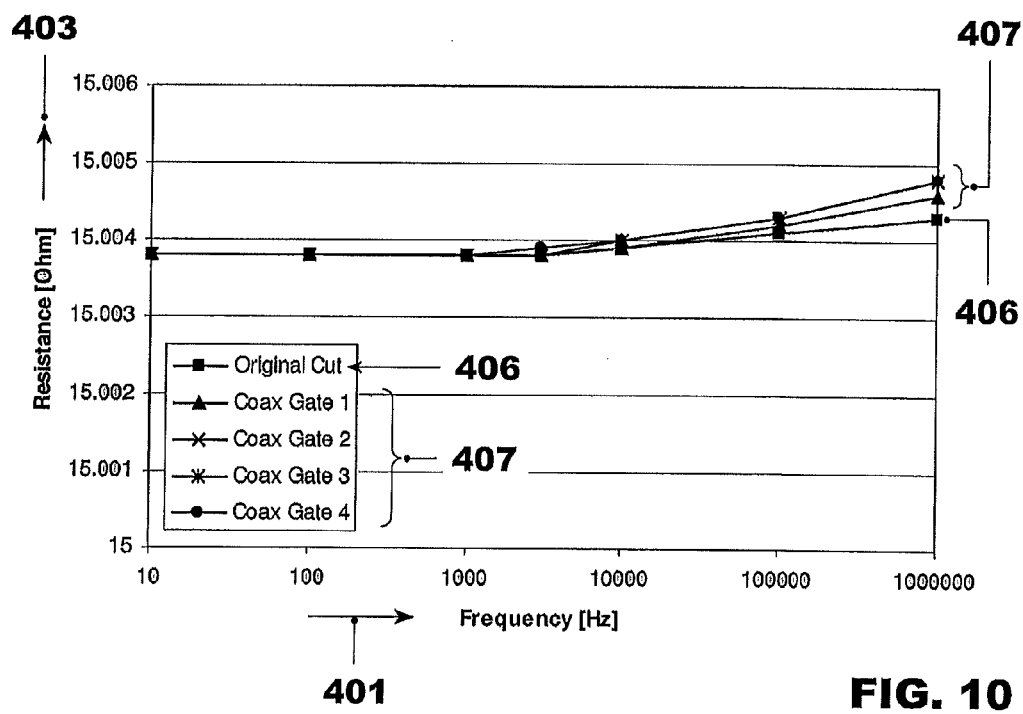
FIG. 10 is a conductor resistance for different semiconductor switching devices as a function of operation frequency.

FIGS. 9 and 10 illustrate inductance and resistance simulations with respect to semiconductor switching devices having cathode-gate connection units 200 according to the first exemplary embodiment of the present disclosure as compared to a known semiconductor switching device shown in FIGS. 1 and 2. In FIGS. 9 and 10, "coax gate" means that different arrangements of cathode-gate connections units 200 according to the first exemplary embodiment of the present disclosure have been analysed. In FIGS. 9 and 10, "original cut" means that the inductance and resistance behavior of a known semiconductor switching device shown in FIGS. 1 and 2 has been simulated.

As shown in FIG. 9, an inductance 402 can be plotted as a function of an operation frequency 401. The frequency is shown from 10 Hz to 1 MHz which is the relevant operational frequency range for IGCTs. A curve having a reference numeral 404 illustrates an inductance distribution without coax gate as in the known art. The curves coax gate 1, coax gate 2, coax gate 3 and coax gate 4 having the reference numeral 405 exhibit an inductance distribution with coax gate. As can be seen, the stray inductance is reduced by up to 40%, especially in the high frequency range.

Furthermore, as shown with reference to FIG. 10, the resistance of the arrangement using a cathode-gate connection unit 200 according to the present disclosure as compared to the known connection employed in a known semiconductor switching device has been simulated. As shown in FIG. 10, a resistance 403 is plotted as the function of the operation frequency 401 in the same frequency range as that shown in FIG. 9, i.e. in the frequency range of interest between 10 Hz and 1 MHz. A curve 406 shows a resistance distribution without coax gate as in the known art, wherein reference numeral 407 indicates a resistance distribution with coax gates, for example, with coax gate 1, coax gate 2, coax gate 3 and coax gate 4 as shown before with respect to FIG. 9.

From the resistance plots shown in FIG. 10, it can be concluded that the increase in resistance 403 provided by the cathode-gate connection unit 200 according to a exemplary embodiment of the present disclosure compared to the resistance of the known arrangement indicated by curve 406 is neglectable.

Thus, it will be appreciated by those skilled in the art that the present invention can be embodied in other specific forms without departing from the spirit or essential characteristics thereof. The presently disclosed embodiments are therefore considered in all respects to be illustrative and not restricted. The scope of the invention is indicated by the appended claims rather than the foregoing description and all changes that come within the meaning and range and equivalence thereof are intended to be embraced therein.

| List Of Reference Numerals | |
|---|---|
| 100 | Semiconductor switching device |
| 101 | Anode |
| 102 | Cathode disc |
| 103 | Gate disc |
| 104 | Housing |
| 105 | Creepage section |
| 106 | Insulation unit |
| 107 | Anode contact layer |
| 108 | Cathode contact layer |
| 109 | Insulation layer |
| 110 | Anode connection |
| 111 | Cathode connection |
| 112 | Substrate |
| 200 | Cathode-gate connection unit |
| 201 | Gate ring |
| 202 | Cathode conductor |
| 203 | Gate conductor |
| 204 | Insulator |
| 301 | Cathode trench |
| 302 | Cathode connection terminal |
| 303 | Gate connection terminal |
| 304 | First cathode pole piece |
| 305 | Second cathode pole piece |
| 401 | Operation frequency |
| 402 | Inductance |
| 403 | Resistance |
| 404 | Inductance distribution without coax gate (prior art) |
| 405 | Inductance distribution with coax gate |
| 406 | Resistance distribution without coax gate (prior art) |
| 407 | Resistance distribution with coax gate |

What is claimed is:

1. A semiconductor switching device, comprising:
a) a substrate having deposited thereon a cathode disc, an anode and a gate of the semiconductor switching device; and
b) a connection for electrically connecting the cathode disc and the gate of the semiconductor switching device to an external circuit unit, wherein
c) the connection comprises:
a cathode-gate connection unit having a coaxial structure including a gate conductor and a cathode conductor for electrically connecting the cathode and the gate of the semiconductor switching device to the external circuit unit, wherein the cathode conductor comprises a cathode connection terminal for connecting the cathode conductor to the cathode disc, and
at least two cathode-gate connection units having a coaxial structure including a gate conductor and a cathode conductor for electrically connecting the cathode and the gate of the semiconductor switching device to the external circuit unit, wherein the at least two cathode-gate connection units are arranged symmetrically around the cathode disc.

2. The semiconductor switching device according to claim 1, wherein the cathode-gate connection unit comprises:
an inner conductor; and
an outer conductor, wherein the inner conductor is insulated from the outer conductor by an insulator comprising a dielectric material.

3. The semiconductor switching device according to claim 2, wherein the inner conductor is insulated from the outer conductor by an insulator comprising a polymer or a ceramic based material.

4. The semiconductor switching device according to claim 2, wherein the insulator has a thickness of less than 500 µm.

5. The semiconductor switching device according to claim 2, wherein the coaxial structure comprises:
a gate conductor for connecting the gate of the semiconductor switching device to the external circuit unit, the gate conductor being formed as the inner conductor of the cathode-gate connection unit and;
a cathode conductor for connecting the cathode of the semiconductor switching device to the external circuit unit, the cathode conductor being formed as the outer conductor of the cathode-gate connection unit.

6. The semiconductor switching device according to claim 1, wherein the semiconductor switching device is an integrated gate commutated thyristor.

7. The semiconductor switching device according to claim 1, wherein the connection for electrically connecting the cathode and the gate of the semiconductor switching device to an external circuit unit is attached to a housing of the semiconductor switching device.

8. The semiconductor switching device according to claim 7, wherein the housing is made of an insulating material.

9. The semiconductor switching device according to claim 8, wherein the housing is made of a ceramic material.

10. The semiconductor switching device according to claim 8, wherein the housing comprises:
at least one creepage section at an outside thereof in order to deviate creepage currents from the anode to the cathode disc.

11. The semiconductor switching device according to claim 1, wherein the cathode disc comprises a cathode pole piece.

12. The semiconductor switching device according to claim 1, wherein the cathode disc comprises:
a first cathode pole piece and a second cathode pole piece.

13. The semiconductor switching device according to claim 1, wherein the cathode conductor of the cathode-gate connection unit comprises:
a cathode connection terminal for connecting the cathode conductor to the cathode disc.

14. The semiconductor switching device according to claim 1, wherein the gate conductor of the cathode-gate connection unit comprises:
a gate connection terminal for connecting the gate conductor to the external circuit unit.

15. The semiconductor switching device according to claim 1, wherein an inner conductor of the cathode-gate connection unit is insulated from an outer conductor of the cathode-gate connection unit by an insulator comprising a dielectric material.

16. The semiconductor switching device according to claim 15, wherein the inner conductor of the cathode-gate connection unit is insulated from the outer conductor of the cathode-gate connection unit by an insulator comprising a polymer or ceramic based material.

17. The semiconductor switching device according to claim 15, wherein the insulator has a thickness of less than 500 µm.

18. The semiconductor switching device according to claim 15, wherein the coaxial structure comprises:
a gate conductor for connecting the gate of the semiconductor switching device to the external circuit unit, the gate conductor being formed as the inner conductor of the cathode-gate connection unit; and a cathode conductor for connecting the cathode of the semiconductor switching device to the external circuit unit, the cathode conductor being formed as the outer conductor of the cathode-gate connection unit.

19. The semiconductor switching device according to claim 1, wherein the semiconductor switching device is an integrated gate commutated thyristor.

20. The semiconductor switching device according to claim 1, wherein the connection electrically connecting the cathode and the gate of the semiconductor switching device to an external circuit unit is attached to a housing of the semiconductor switching device.

21. The semiconductor switching device according to claim 20, wherein the housing is made of an insulating material.

22. The semiconductor switching device according to claim 21, wherein the housing comprises:

at least one creepage section at an outside thereof in order to deviate creepage currents from the anode to the cathode disc.

23. The semiconductor switching device according to claim 21, wherein the coaxial structure comprises:

a gate connector for connecting the gate of the semiconductor switching device to the external circuit unit, the gate connector being formed as the outer conductor of the cathode-gate connection unit; and a cathode conductor for connecting the cathode of the semiconductor switching device to the external circuit unit, the cathode conductor being formed as the inner conductor of the cathode-gate connection unit.

24. The semiconductor switching device according to claim 21, wherein the coaxial structure comprises:

a gate conductor for connecting the gate of the semiconductor switching device to the external circuit unit, the gate conductor being formed as the outer conductor of the cathode-gate connection unit; and a cathode conductor for connecting the cathode of the semiconductor switching device to the external circuit unit, the cathode conductor being formed as the inner conductor of the cathode-gate connection unit.

25. The semiconductor switching device according to claim 20, wherein the housing is made of a ceramic material.

26. The semiconductor switching device according to claim 1, wherein the cathode disc comprises:

a cathode pole piece.

27. The semiconductor switching device according to claim 1, wherein the cathode disc comprises:

a first cathode pole piece and a second cathode pole piece.

28. The semiconductor switching device according to claim 1, wherein the cathode conductor of the cathode-gate connection unit comprises:

a cathode connection terminal for connecting the cathode conductor to the cathode disc.

29. The semiconductor switching device according to claim 1, wherein the gate conductor of the cathode-gate connection unit comprises:

a gate connection terminal for connecting the gate conductor to the external circuit unit.

30. The semiconductor switching device according to claim 1, wherein the at least two cathode gate connections units are arranged around a periphery of the housing of the semiconductor switching device.

* * * * *